(12) United States Patent
Kojima

(10) Patent No.: US 8,222,056 B2
(45) Date of Patent: Jul. 17, 2012

(54) MANUFACTURING METHOD OF LIGHT-EMITTING DIODE

(75) Inventor: Kensuke Kojima, Kanagawa (JP)

(73) Assignee: Sony Corporation, Tokyo (JP)

( * ) Notice: Subject to any disclaimer, the term of this patent is extended or adjusted under 35 U.S.C. 154(b) by 163 days.

(21) Appl. No.: 12/763,364

(22) Filed: Apr. 20, 2010

(65) Prior Publication Data

US 2010/0289000 A1    Nov. 18, 2010

(30) Foreign Application Priority Data

May 13, 2009   (JP) .............................. P2009-116348

(51) Int. Cl.
H01L 21/00 (2006.01)
(52) U.S. Cl. .................. 438/22; 257/E21.215
(58) Field of Classification Search .................... 257/13, 257/79, 98, E33.008, E21.215; 438/22, 39, 438/46, 40, 43, 494
See application file for complete search history.

(56) References Cited

U.S. PATENT DOCUMENTS

| | | | | |
|---|---|---|---|---|
| 5,296,717 | A | * | 3/1994 | Valster et al. .................. 257/13 |
| 5,418,374 | A | * | 5/1995 | Morita et al. .................. 257/13 |
| 2002/0117677 | A1 | | 8/2002 | Okuyama |
| 2006/0169997 | A1 | * | 8/2006 | Suzuki et al. .................. 257/95 |

FOREIGN PATENT DOCUMENTS

| | | |
|---|---|---|
| JP | 10-242507 | 9/1998 |
| JP | 2002-100805 | 4/2002 |
| JP | 2005-150673 | 6/2005 |

* cited by examiner

Primary Examiner — A. Sefer
Assistant Examiner — Nikolay Yushin
(74) Attorney, Agent, or Firm — K&L Gates LLP

(57) ABSTRACT

A manufacturing method of a light-emitting diode, includes the steps of: successively growing a first clad layer, an active layer and a second clad layer on a substrate; and patterning the first clad layer, the active layer and the second clad layer into a specified plane shape, and causing at least a part of an outer peripheral part of the active layer to protrude to an outside from at least one of the first clad layer and the second clad layer.

6 Claims, 14 Drawing Sheets

Prior Art

MANUFACTURING METHOD OF LIGHT-EMITTING DIODE

CROSS REFERENCES TO RELATED APPLICATIONS

The present application claim priority to Japanese Priority Patent Application JP 2009-116348 filed in the Japan Patent Office on May 13, 2009, the entire contents of which is hereby incorporated by reference.

BACKGROUND

The present application relates to a light-emitting diode and a manufacturing method of the same, and particularly to a minute light-emitting diode.

In recent years, a minute light-emitting diode having a size of several tens µm is proposed (see, for example, International Publication No. Wo 02/07231 and JP-A-2005-150673 (patent documents 1 and 2)). FIG. 14 shows, as an example of such a light-emitting diode, an AlGaInP based light-emitting diode. As shown in FIG. 14, in order to manufacture the AlGaInP based light-emitting diode, an etching stop layer is grown on a not-shown n-type GaAs substrate, and an n-type AlInP clad layer 101, an active layer 102 and a p-type AlInP clad layer 103 are successively grown thereon. Next, the n-type AlInP clad layer 101, the active layer 102 and the p-type AlInP clad layer 103 are subjected to dry etching by using a mask having a specified plane shape and are patterned, and an end face 104 including an inclined surface inclined with respect to the surfaces of these layers is formed. Thereafter, although not shown, a p-side electrode is formed on the upper surface of the p-type AlInP clad layer 103, and an n-side electrode is formed on the lower surface of the n-type AlInP clad layer 101. In the AlGaInP based light-emitting diode, light generated in the active layer 102 is reflected by the end face 104, and is directed to the lower surface of the n-type AlInP clad layer 101, that is, the exit surface, so that light extraction efficiency is enhanced.

Incidentally, there is proposed a manufacturing method of a light-emitting diode in which in an end face emission type light-emitting diode including at least a light-emitting section of a double heterojunction structure in which upper and lower surfaces of an active layer are sandwiched between clad layers, and an electrode pair for injecting carriers into the light-emitting section, a light extraction surface of the light-emitting section is formed into a reverse mesa shape by wet etching (see, for example, JP-A-10-242507 (patent document 3)).

SUMMARY

However, in the related art AlGaInP based light-emitting diode shown in FIG. 14, since an AlGaInP compound semiconductor crystal is a crystal easily damaged by dry etching, etching damage occurs in an outer peripheral part of the active layer 102 at the dry etching. Thus, many non-emission recombination centers not contributing to light emission exist in the outer peripheral part of the active layer 102. As a result, carriers injected into the outer peripheral part of the active layer 102 at the time of driving the AlGaInP based light-emitting diode are consumed by the non-emission recombination centers existing in the outer peripheral part, and there is a problem that the light emission efficiency is significantly reduced.

This problem is not limited to the AlGaInP based light-emitting diode, and can occur also in another light-emitting diode.

It is therefore desirable to provide a light-emitting diode in which the light emission efficiency can be greatly improved, and a manufacturing method of the same.

According to an embodiment, there is provided a manufacturing method of a light-emitting diode including the steps of: successively growing a first clad layer, an active layer and a second clad layer on a substrate; and patterning the first clad layer, the active layer and the second clad layer into a specified plane shape, and causing at least a part of an outer peripheral part of the active layer to protrude to an outside from at least one of the first clad layer and the second clad layer.

Typically, the first clad layer, the active layer and the second clad layer are patterned into the specified plane shape by dry etching. Besides, typically, at least one of the first clad layer and the second clad layer, or preferably both of them are side-etched with respect to the active layer, so that at least the part of the peripheral part of the active layer, preferably most thereof, or most preferably the whole thereof protrudes to the outside from at least one of the first clad layer and the second clad layer, or preferably both thereof. The side etching is typically performed by wet etching. An etchant (etching liquid) used for the wet etching is suitably selected according to the semiconductor constituting the first clad layer, the active layer and the second clad layer. The side etching by the wet etching is especially effective when the first clad layer, the active layer and the second clad layer are made of phosphorous-based compound semiconductor. In order to side-etch at least one of the first clad layer and the second clad layer with respect to the active layer, after the first clad layer, the active layer and the second clad layer are patterned by dry etching, the end face of the active layer is altered in quality before the wet etching is performed. By altering the quality of the end face of the active layer as stated above, the etching rate of the active layer at the wet etching can be made sufficiently low as compared with the etching rate of the first clad layer and the second clad layer. As a result, it is possible to easily form the structure in which at least the part of the outer peripheral part of the active layer protrudes to the outside from at least one of the first clad layer and the second clad layer. This method is very effective especially when the active layer has a multiple quantum well structure. As methods of altering the quality of the end face of the active layer, there are various methods such as a method in which when the first clad layer, the active layer and the second clad layer are patterned by dry etching, or thereafter, significant etching damage is caused on the end face of the active layer, and a method is selected as the need arises.

Besides, according to another embodiment, there is provided a light-emitting diode including a first clad layer, an active layer on the first clad layer, and a second clad layer on the active layer, in which at least a part of an outer peripheral part of the active layer protrudes to an outside from at least one of the first clad layer and the second clad layer.

In an embodiment, although the size of the light-emitting diode is not particularly limited, generally, the maximum size is 50 µm or less, and typically 30 µm or less. As semiconductors constituting the first clad layer, the active layer and the second clad layer of the light-emitting diode, various semiconductors such as III-V compound semiconductors and II-VI compound semiconductors can be used. Specific examples of the light-emitting diodes using the III-V compound semiconductors or the II-VI compound semiconductors, together with light emission wavelength bands, are as mentioned below.

1. III-V Compound Semiconductor
HeterojunctionEmission wavelength
AlN/AlInGaNultraviolet
InGaN/GaNblue, green
GaInP/AlGaInPred
GaInP/AlGaPred
AlGaAs/InGaAsred
AlGaAs/AlGaPred
GaInAsP/GaPinfrared
GaInNP/AlGaPinfrared
GaAs/AlGaAsinfrared 2. II-VI compound semiconductor
ZnO/ZnMgOblue
ZnTe/ZnMgTegreen
ZnCdSe/BeZnTeyellow green
MgSe/BeZnTeyellow green
MgSe/ZnCdSeyellow green Specific examples of the III-V compound semiconductors are as mentioned below.

GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb

Specific examples of the II-V compound semiconductors are as mentioned below.

CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe

In an embodiment constructed as described above, since the structure is made such that the outer peripheral part of the active layer protrudes from at least one of the first clad layer and the second clad layer, when current is applied to drive the light-emitting diode, the current can be made not to flow through the outer peripheral part of the active layer where there are many non-emission recombination centers. Besides, since the structure is made such that the outer peripheral part of the active layer protrudes from at least one of the first clad layer and the second clad layer, the light generated in the active layer at the time of driving the light-emitting diode can be extracted also from the end face of the protrusion to the outside.

According to an embodiment, the problem that carriers injected into the outer peripheral part of the active layer are consumed by the non-emission recombination centers can be eliminated, and the light extraction efficiency can be improved, and therefore, the light emission efficiency of the light-emitting diode can be greatly improved.

Additional features and advantages are described herein, and will be apparent from the following Detailed Description and the figures.

DETAILED DESCRIPTION

The present application will be described below in greater detail according to an embodiment.

1. First embodiment (AlGaInP based light-emitting diode and manufacturing method of the same)

2. Second embodiment (manufacturing method of AlGaInP based light-emitting diode)

3. Third embodiment (manufacturing method of AlGaInP based light-emitting diode)

4. Fourth embodiment (manufacturing method of AlGaInP based light-emitting diode)

5. Fifth embodiment (manufacturing method of AlGaInP based light-emitting diode)

6. Sixth embodiment (manufacturing method of AlGaInP based light-emitting diode)

7. Seventh embodiment (GaN based light-emitting diode and manufacturing method of the same)

1. First Embodiment

AlGaInP based light-emitting diode and manufacturing method of the same

Figure 1A:
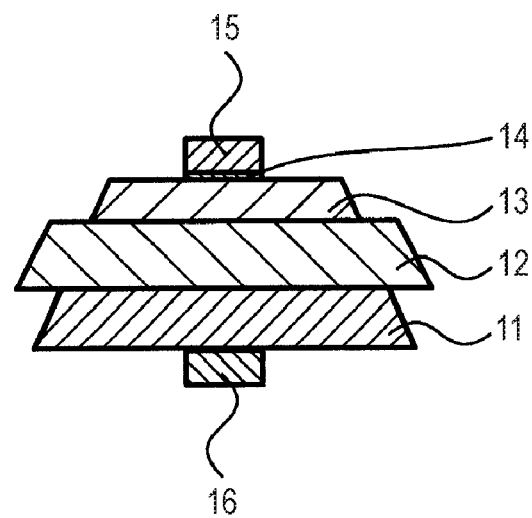
FIGS. 1A and 1B are a sectional view and a plan view showing an AlGaInP based light-emitting diode according to a first embodiment.
Figure 1B:
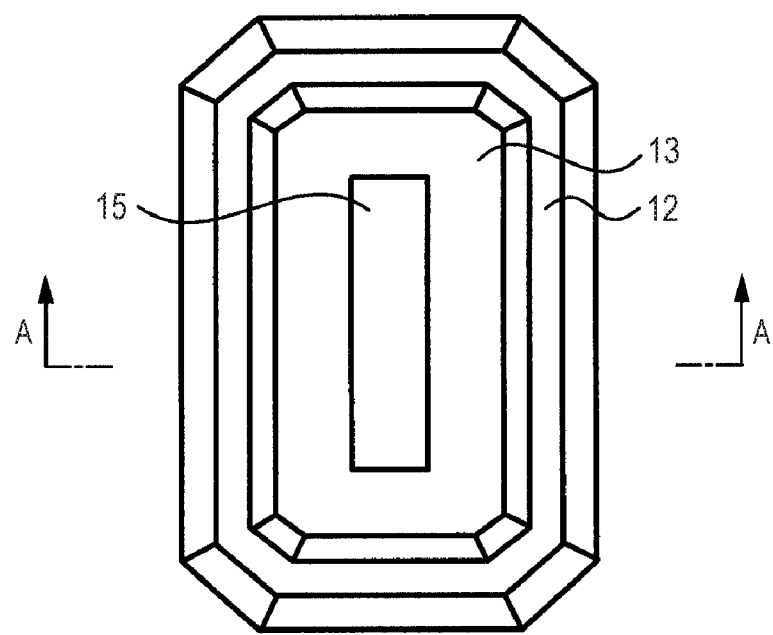

FIG. 1A is a sectional view showing an AlGaInP based light-emitting diode according to a first embodiment, and FIG. 1B is a plan view showing an example of a plane shape of the AlGaInP based light-emitting diode. FIG. 1A is a sectional view taken along line A-A of FIG. 1B.

As shown in FIG. 1A and FIG. 1B, in the AlGaInP based light-emitting diode, a light-emitting diode structure includes an n-type AlInP clad layer 11, an active layer 12 thereon, and a p-type AlInP clad layer 13 thereon. Each of the n-type AlInP clad layer 11, the active layer 12, and the p-type AlInP clad layer 13 has, for example, an (001) orientation. In this case, the active layer 12 has, for example, an AlGaInP/GaInP multiple quantum well (MQW) structure including a barrier layer of an AlGaInP layer and a well layer of a GaInP layer. In this case, each of the n-type AlInP clad layer 11, the active layer 12 and the p-type AlInP clad layer 13 has a plane shape in which respective corner parts of a rectangle are beveled, however, no limitation is made to this.

The outer peripheral part of the active layer 12 protrudes to the outside from the n-type AlInP clad layer 11 and the p-type AlInP clad layer 13 all over the whole outer periphery of the active layer 12. In other words, the outer peripheral part of the active layer 12 is not sandwiched between the n-type AlInP clad layer 11 and the p-type AlInP clad layer 13. Although the length of the protrusion of the active layer 12 is, for example, 0.3 to 2 μm, no limitation is made to this. The length of the protrusion of the active layer 12 may not be the same all over the outer periphery of the active layer 12. Besides, the end faces of the n-type AlInP clad layer 11, the active layer 12 and the p-type AlInP clad layer 13 are inclined surfaces inclined by an angle θ ($0<\theta<90°$, for example, $30°<\theta<60°$) with respect to the principal surfaces of these layers. Except for the protrusion of the active layer 12, the sectional shape of the n-type AlInP clad layer 11, the active layer 12 and the p-type AlInP clad layer 13 is trapezoidal. Although the end faces of the n-type AlInP clad layer 11, the active layer 12 and the p-type AlInP clad layer 13 in the section shown in FIG. 1A have typically inclined surfaces made of (111) surfaces, no limitation is made to this.

A p-side electrode 15 having, for example, a rectangular plane shape is formed on the p-type AlInP clad layer 13 through a p-type GaAs layer 14. An n-side electrode 16 having, for example, a rectangular plane shape is formed on the lower surface of the n-type AlInP clad layer 11.

In the AlGaInP based light-emitting diode, as the need arises, a transparent resin (not shown) is formed on the end faces of the n-type AlInP clad layer 11, the active layer 12 and the p-type AlInP clad layer 13, and a surface of the p-type AlInP clad layer 13 at a peripheral portion of the p-side electrode 15.

A current made to flow between the p-side electrode 15 and the n-side electrode 16 at the time of driving the AlGaInP based light-emitting diode flows through the active layer 12 at a portion sandwiched between the n-type AlInP clad layer 11 and the p-type AlInP clad layer 13. The light is generated in the active layer 12 at the portion through which the current flows. The current does not flow through the active layer 12 at a portion not sandwiched between the n-type AlInP clad layer 11 and the p-type AlInP clad layer 13. The light generated in the active layer 12 circulates while repeating reflection in the inside of the light-emitting diode structure including the n-type AlInP clad layer 11, the active layer 12 and the p-type AlInP clad layer 13. The circulating light is efficiently extracted to the outside from the lower surface of the n-type AlInP clad layer 101 by the reflection at the end faces of the n-type AlInP clad layer 11 and the p-type AlInP clad layer 13 inclined by the angle θ. In addition to this, the circulating light is efficiently extracted to the outside from the end face of the active layer 12 of the portion protruding to the outside from the n-type AlInP clad layer 11 and the p-type AlInP clad layer 13. By this, the circulating light in the inside of the light-emitting diode structure including the active layer and the p-type AlInP clad layer 13 can be efficiently extracted to the outside.

Next, a manufacturing method of the AlGaInP based light-emitting diode will be described.

Figure 2A:
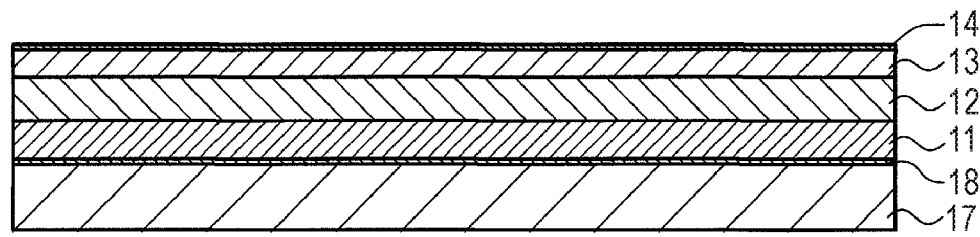
FIGS. 2A to 2C are sectional views for explaining a manufacturing method of the AlGaInP based light-emitting diode according to the first embodiment.

As shown in FIG. 2A, first, an n-type GaAs etching stop layer 18 is grown on an n-type GaAs substrate 17 having, for example, a (001) principal surface by, for example, an organic metal chemical vapor deposition (MOCVD) method at a temperature of, for example, about 800° C., and an n-type AlInP clad layer 11, an active layer 12, a p-type AlInP clad layer 13 and a p-type GaAs layer 14 are successively grown thereon. The thickness of the n-type GaAs etching stop layer 18 is, for example, 500 nm, and the thickness of the p-type GaAs layer 14 is, for example, 50 nm.

The growth raw materials for the AlGaInP based semiconductor layers are as mentioned below. As the raw material of Ga, for example, trimethylgallium (($CH_3)_3$Ga, TMG) is used. As the raw material of Al, for example, trimethylaluminum (($CH_3)_3$Al, TMA) is used. As the raw material of In, for example, trimethylindium (($CH_3)_3$In, TMI) is used. As the raw material of P, for example, phosphine ($PH_3$) is used. With respect to dopants, for example, hydrogen selenide ($H_2$Se) is used as an n-type dopant, and for example, dimethylzinc (($CH_3)_2$Zn, DMZn) is used as a p-type dopant.

Next, the n-type GaAs substrate 17 on which the AlGaInP based semiconductor layers are grown as described above is extracted from the MOCVD apparatus.

Figure 2B:
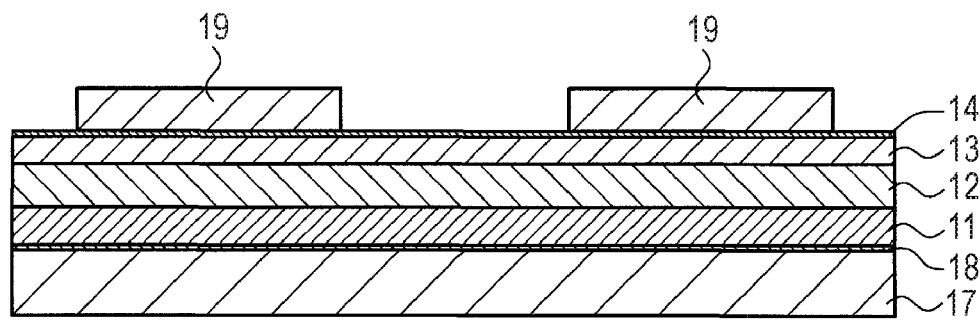
Figure 4:
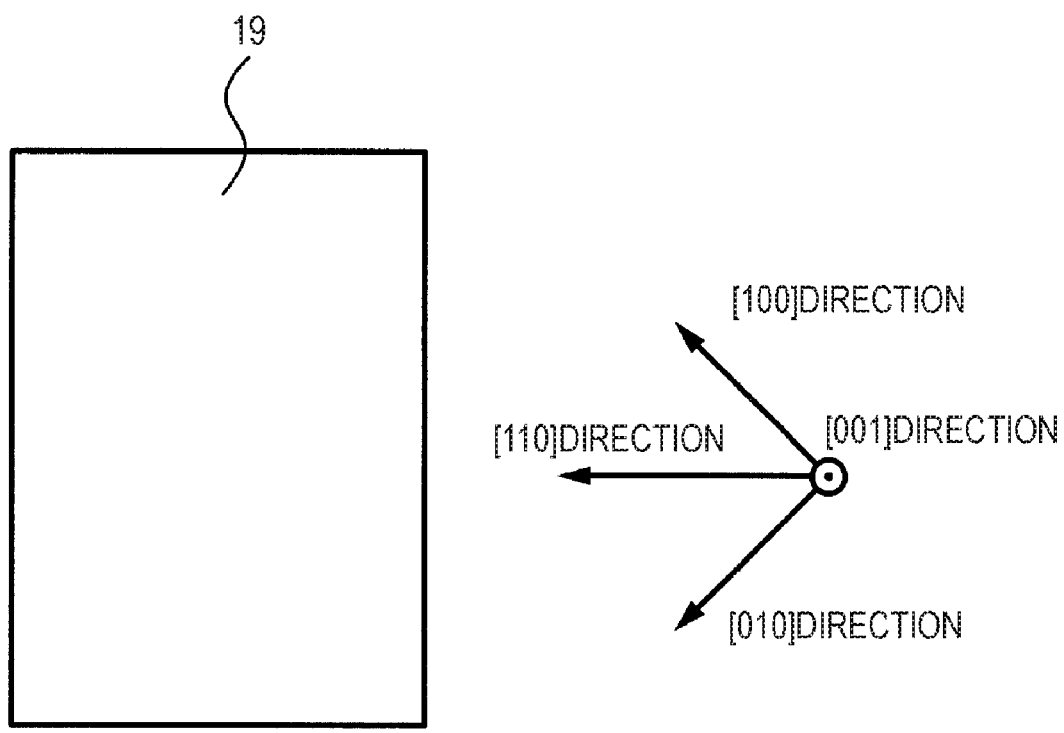
FIG. 4 is a plan view showing a mask used at the time of etching in the manufacturing method of the AlGaInP based light-emitting diode according to the first embodiment.

Next, as shown in FIG. 2B, a resist pattern 19 having a rectangular plane shape is formed by lithography on the p-type GaAs layer 14. As shown in FIG. 4, the resist pattern 19 is formed in such a manner that the long side thereof is perpendicular to the [110] direction of the n-type AlInP clad layer 11, the active layer 12, the p-type AlInP clad layer 13 and the p-type GaAs layer 14.

Figure 2C:
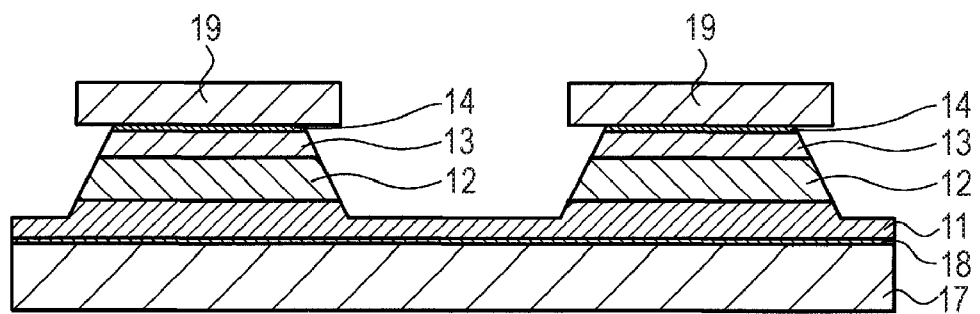

Next, the resist pattern 19 is used as a mask, and etching is performed up to a halfway depth of the n-type AlInP clad layer 11 in the thickness direction by dry etching, for example, reactive ion etching (ME) under a condition in which taper etching is performed. In this dry etching, for example, a chlorine ($Cl_2$) based gas is used as an etching gas. In this way, as shown in FIG. 2C, an end face of an inclined surface inclined with respect to the principal surface of the n-type GaAs substrate 17 is formed in a parallel direction to the long side of the resist pattern 19. At the time of the dry etching, the end face of the active layer 12 having the MQW structure is altered in quality by being subjected to more etching damage than the end face of the n-type AlInP clad layer 11 and the p-type AlInP clad layer 13. The altered layer formed in this way is considered to be in a state where for example, the well layer and the barrier layer of the active layer 12 are broken by etching damage and those constituent elements are mixed at random, that is, a pseudo alloyed (alloyed) state.

Figure 3A:
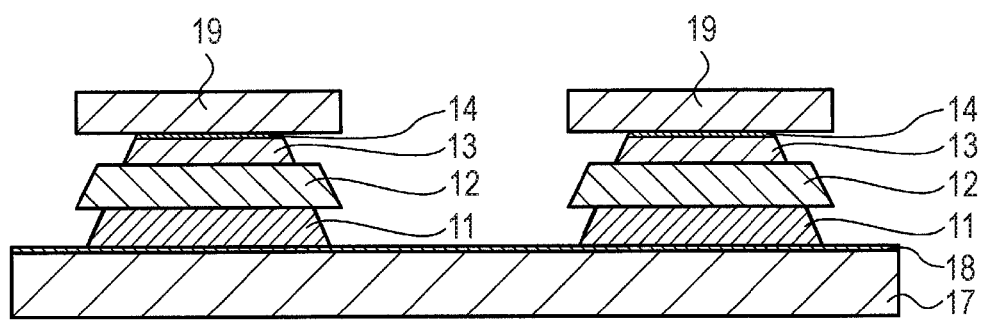
FIGS. 3A and 3B are sectional views for explaining the manufacturing method of the AlGaInP based light-emitting diode according to the first embodiment.

Continuously, the resist pattern 19 is used as the mask, and the p-type GaAs layer 14, the p-type AlInP clad layer 13, the active layer 12 and the n-type AlInP clad layer 11 are successively etched by wet etching. In this wet etching, the etching is stopped at the time point when the n-type GaAs etching stop layer 18 is exposed. As an etchant of the wet etching, hydrochloric acid cooled to a low temperature of, for example, 5° C. or lower, preferably 0° C. or lower, more preferably −5° C. or lower, or further preferably −10° C. or lower. Although the etchant made of hydrochloric acid etches the AlGaInP based semiconductors unselectively, since the end face of the active layer 12 is altered in quality by the etching damage as described above, the rate of side etching of the active layer 12 is significantly low as compared with the rate of side etching of the n-type AlInP clad layer 11 and the p-type AlInP clad layer 13. In other words, the n-type AlInP clad layer 11 and the p-type AlInP clad layer 13 are side-etched at significantly higher etching rate as compared with the active layer 12. As a result, as shown in FIG. 3A, the structure is formed in which the outer peripheral part of the active layer 12 protrudes to the outside from the n-type AlInP clad layer 11 and the p-type AlInP clad layer 13. Besides, the end faces of the n-type AlInP clad layer 11, the active layer 12 and the p-type AlInP clad layer 13 perpendicular to the [110] direction become inclined surfaces typically made of (111) surfaces.

Next, the resist pattern 19 is removed.

Figure 3B:
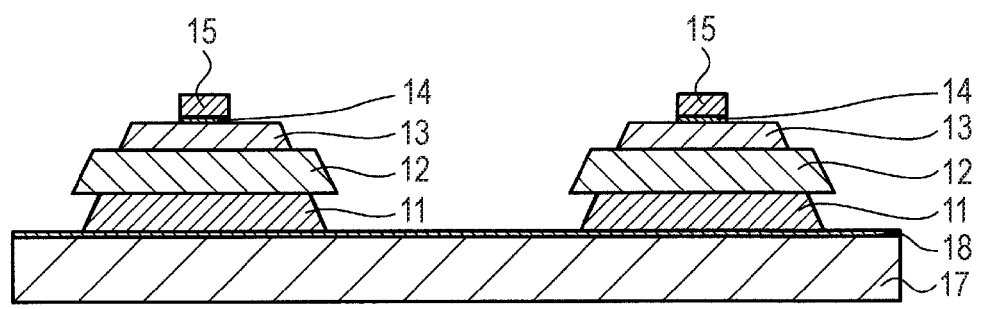

Next, a resist pattern (not shown) having a specified plane shape is formed on the surface of the substrate by lithography, and further, for example, an Au film, a Pt film and an Au film are successively formed on the whole surface of the substrate by, for example, a sputtering method. Thereafter, the resist pattern, together with the Au film, the Pt film and the Au film formed thereon, is removed (lift-off). By this, as shown in FIG. 3B, a p-side electrode 15 having an Au/Pt/Au structure and a rectangular plane shape is formed on the p-type GaAs layer 14. Next, the p-type GaAs layer 14 at a portion except for the p-side electrode 15 is removed by etching.

Next, the p-side electrode 15 side of the AlGaInP light-emitting diode is bonded to another separately prepared substrate, for example, a sapphire substrate (not shown) by resin or the like.

Next, the n-type GaAs substrate 17 is removed by wet etching using, for example, an ammonia-based etchant from the back side, and continuously, the n-type GaAs etching stop layer 18 is also removed by etching. At this time point, there occurs a state where the respective AlGaIn based light-emitting diodes are separated from each other.

Next, a resist pattern (not shown) having a specified plane shape is formed by lithography on the surface of the n-type AlInP clad layer 11, and further, for example, a Pd film, an AuGe film and an Au film are successively formed on the whole surface by, for example, a sputtering method. Thereafter, this resist pattern, together with the Pd film, the AuGe film and the Au film formed thereon, is removed (lift-off). By this, an n-side electrode 16 having a Pd/AuGe/Au structure and a rectangular plane shape is formed on the n-type AlInP clad layer 11.

Thereafter, the sapphire substrate to which the p-side electrode 15 side is bonded is removed, and the respective AlGaInP based light-emitting diodes are separated from each other.

By the above, as shown in FIGS. 1A and 1B, the objective AlGaInP based light-emitting diode is completed. The AlGaInP based light-emitting diode manufactured in this way may be used as a single component according to usage, or may be bonded to another substrate, transferred, or subjected to wiring connection.

Here, a result obtained by calculating the light extraction efficiency of the AlGaInP based light-emitting diode by ray tracing will be described. In this calculation, the thicknesses of the n-type AlInP clad layer 11 and the p-type AlInP clad layer 13 are respectively made 0.5 µm, the thickness of the active layer 12 is made 0.8 µm, and the total thickness is made 1.8 µm. Incidentally, in this calculation, the p-type GaAs layer 14 is neglected. Besides, the length of the upper bottom of the trapezoidal sectional shape shown in FIG. 1A is 9 µm, the length of the lower bottom is 14 µm, the length of the depth is 14 µm, and the area of the active layer 12 is 178 µm². The refractive indexes of the n-type AlInP clad layer 11, the active layer 12 and the p-type AlInP clad layer 13 are 3.1. As a result of the calculation under this condition, the light extraction efficiency is 13.39%.

Figure 14:
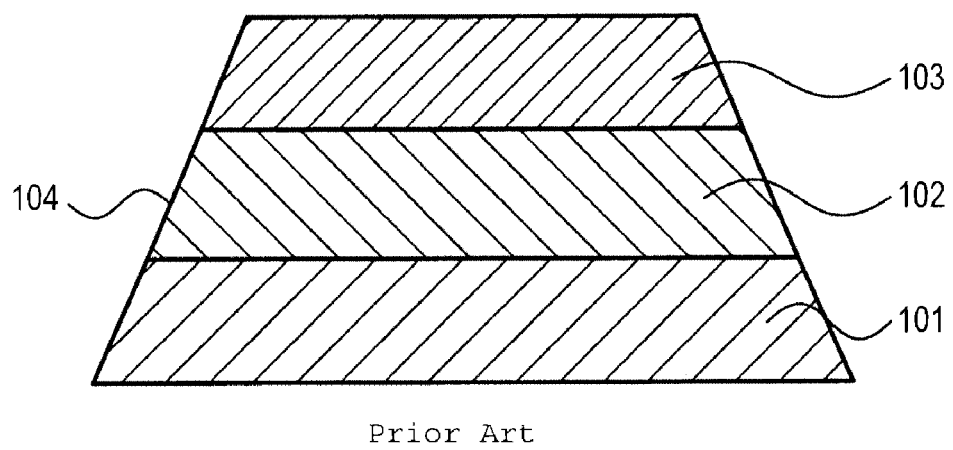
FIG. 14 is a sectional view showing a related art AlGaInP based light-emitting diode.

On the other hand, the light extraction efficiency of the related art AlGaInP based light-emitting diode having the trapezoid sectional shape as shown in FIG. 14 is calculated under the same condition, and a result, the light extraction efficiency is 3.88%. Further, the light extraction efficiency of the AlGaInP based light-emitting diode shown in FIG. 14 is calculated while the condition of the calculation is changed. Specifically, the calculation is performed while the thicknesses of the n-type AlInP clad layer 101 and the p-type AlInP clad layer 103 are respectively changed to 1.0 µm, the thickness of the active layer 102 is changed 0.8 µm, the total thickness is changed to 2.8 µm, the length of the upper bottom of the trapezoidal sectional shape shown in FIG. 14 is changed to 6.5 µm, the length of the lower bottom is changed to 14 µm, and the area of the active layer is changed 138 µm². As a result, the light extraction efficiency is 4.16%. The light extraction efficiency is higher than 3.88% by 0.28%, and this is because the area of the end face 104 is enlarged by the increase of the total thickness of the n-type AlInP clad layer 101, the active layer 102 and the p-type AlInP clad layer 103.

As is understood from the above, the light extraction efficiency of the AlGaInP based light-emitting diode according to the first embodiment is about three or more times larger than the light extraction efficiency of the related art AlGaInP based light-emitting diode shown in FIG. 14. The significant increase in the light extraction efficiency is obtained since, in the AlGaInP based light-emitting diode according to the first embodiment, the active layer 12 protrudes to the outside from the n-type AlInP clad layer 11 and the p-type AlInP clad layer 13. That is, this is because the light is extracted to the outside also from the end face of the active layer 12 protruding to the outside in addition to the lower surface of the n-type AlInP clad layer 11.

EXAMPLE

The thicknesses of the n-type AlInP clad layer 11 and the p-type AlInP clad layer 13 are respectively made 0.5 µm, the thickness of the active layer 12 is made 0.8 µm, and the total thickness is made 1.8 µm Besides, the length of the upper bottom of the trapezoidal sectional shape shown in FIG. 1A is made 9 µm, the length of the lower bottom is made 14 µm, and the length of the depth is made 14 µm The active layer 12 has a MQW structure including a $Ga_{0.5}In_{0.5}P$ well layer and an $(Al_{0.5}Ga_{0.5})_{0.5}In_{0.5}P$ barrier layer.

Dry etching by ME for patterning the n-type AlInP clad layer 11, the active layer 12 and the p-type AlInP clad layer 13 is performed using an induction coupling plasma (ICP) dry etching apparatus. The etching condition is as mentioned below.

Etching gas: $Cl_2$ gas
Pressure: 0.66 Pa
Plasma power: 200 W
Bias power: 100 W
Etching depth: 1.6 µm Under this etching condition, the etching selection ratio of resist to AlGaInP is close to 1:1, and the controllability of etching is excellent. The subsequent wet etching is performed using an etchant of hydrochloric acid cooled to −15° C.

Figure 5:
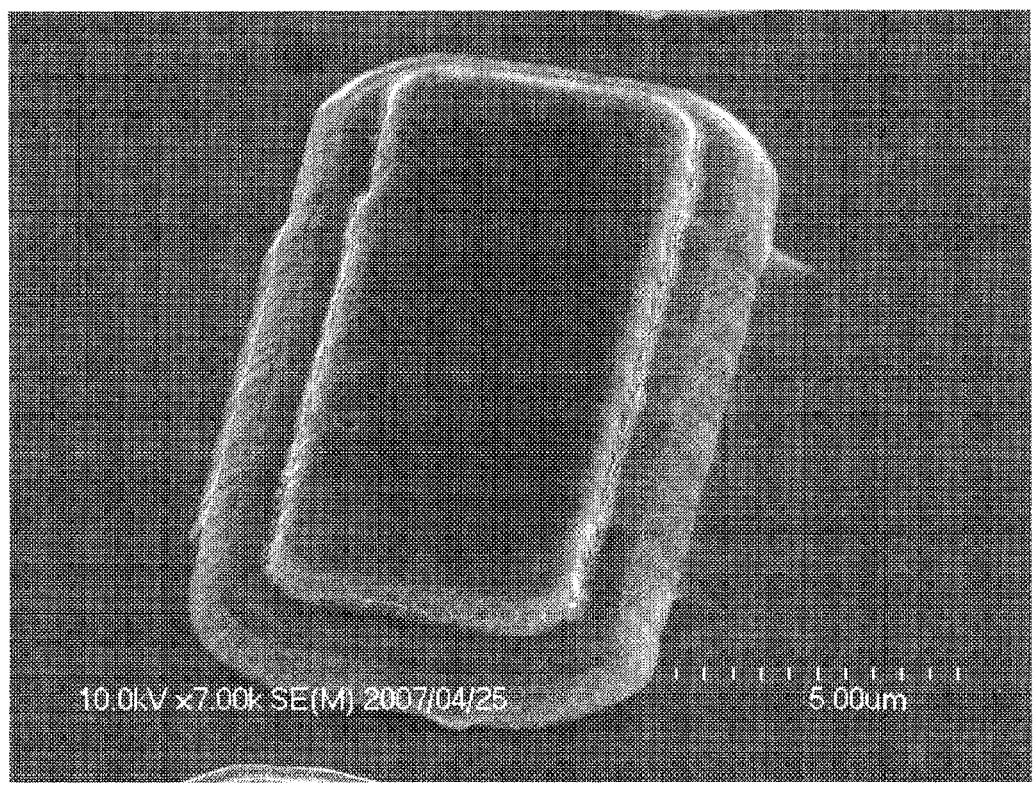
FIG. 5 is a photograph showing a SEM image of the AlGaInP based light-emitting diode according to the first embodiment.
Figure 6:
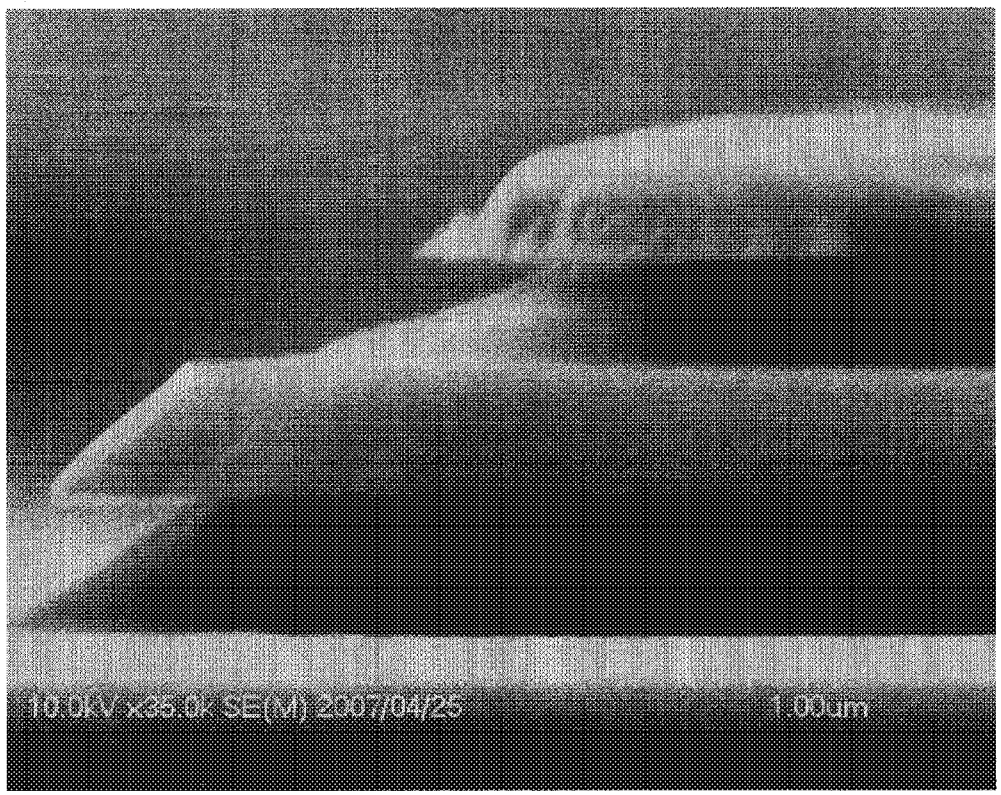
FIG. 6 is a photograph showing a SEM image of the AlGaInP based light-emitting diode according to the first embodiment.

FIG. 5 and FIG. 6 show SEM images when the AlGaInP based light-emitting diode after the wet etching is performed is observed from the p-type AlInP clad layer 13 side and the side surface side by a scanning electron micrograph (SEM). As shown in FIG. 5 and FIG. 6, it is understood that the outer peripheral part of the active layer 12 protrudes from the n-type AlInP clad layer 11 and the p-type AlInP clad layer 13.

Figure 7:
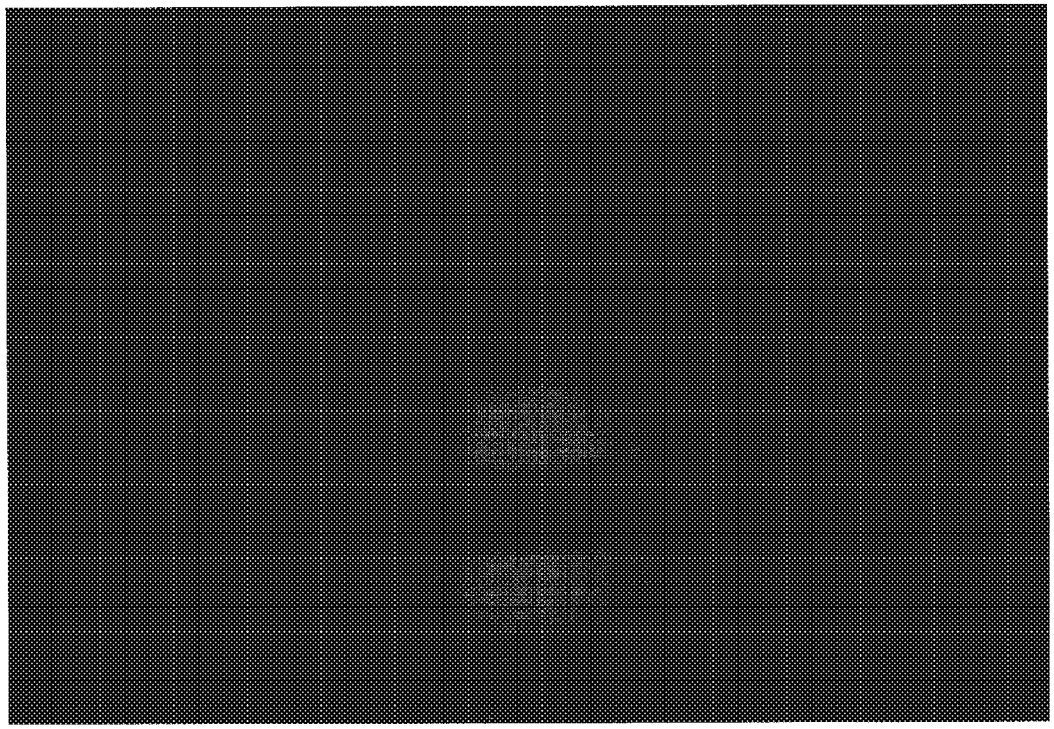
FIG. 7 is a photograph showing an electroluminescence image of the AlGaInP based light-emitting diode according to the first embodiment.

FIG. 7 shows an electroluminescence image from the n-type AlInP clad layer 11 side of the AlGaInP based light-emitting diode in the state where the p-side electrode 15 and the n-side electrode 16 are formed. From FIG. 7, it is understood that light exits from the outer peripheral part of the active layer 12 protruding to the outside.

As described above, according to the first embodiment, since the outer peripheral part of the active layer 12 protrudes from the n-type AlInP clad layer 11 and the p-type AlInP clad layer 13, the AlGaInP based light-emitting diode having very high light extraction efficiency as compared with the related art can be realized. Besides, at the time of driving the AlGaInP based light-emitting diode, since a current can be made not to flow through the outer peripheral part of the active layer 12 where there are many non-emission recombination centers, the problem that carriers injected into the outer peripheral part of the active layer 12 are wastefully consumed by the non-emission recombination centers is eliminated. From the above, the AlGaInP based light-emitting diode having very high light emission efficiency as compared with the related art AlGaInP based light-emitting diode shown in FIG. 14 can be obtained. In the AlGaInP based light-emitting diode, the effect of the improvement of the light emission efficiency is remarkable especially in a lower current region.

The AlGaInP based light-emitting diode is appropriately used for various electronic equipments such as a light-emitting diode display, a light-emitting diode backlight, and a light-emitting diode illumination apparatus.

2. Second Embodiment

Manufacturing Method of AlGaInP Based Light-emitting Diode

In a manufacturing method of an AlGaInP based light-emitting diode according to a second embodiment, similarly to the manufacturing method of the AlGaInP based light-emitting diode according to the first embodiment, a resist pattern 19 is used as a mask and patterning is performed by dry etching. Differently from the first embodiment, at this time point, etching damage of the end face of an active layer 12 may be low.

Next, the end face of the active layer 12 is damaged by performing an ashing process and by the action of an oxygen plasma, and is altered in quality by performing a heat treatment. By doing so, similarly to the first embodiment, the etching rate of the end face of the active layer 12 can be made sufficiently low as compared with the etching rate of the n-type AlInP clad layer 11 and the p-type AlInP clad layer 13.

Thereafter, the process is made to proceed similarly to the first embodiment, and the objective AlGaInP based light-emitting diode is manufactured.

According to the second embodiment, the same merits as those of the first embodiment can be obtained.

3. Third Embodiment

Manufacturing Method of AlGaInP Based Light-emitting Diode

In a manufacturing method of an AlGaInP based light-emitting diode according to a third embodiment, similarly to the manufacturing method of the AlGaInP based light-emitting diode according to the first embodiment, a resist pattern 19 is used as a mask and patterning is performed by dry etching. Differently from the first embodiment, at this time point, etching damage of the end face of an active layer 12 may be low.

Next, anneal is performed in an atmosphere including a specified reactive gas, so that the end face of the active layer 12 is made to react with the reactive gas, and is pseudo alloyed. By doing so, similarly to the first embodiment, the etching rate of the end face of the active layer 12 can be made sufficiently low as compared with the etching rate of the n-type AlInP clad layer 11 and the p-type AlInP clad layer 13.

Thereafter, the process is made to proceed similarly to the first embodiment, and the objective AlGaInP based light-emitting diode is manufactured.

According to the third embodiment, the same merits as those of the first embodiment can be obtained.

4. Fourth Embodiment

Manufacturing Method of AlGaInP Based Light-emitting Diode

In a manufacturing method of an AlGaInP based light-emitting diode according to a fourth embodiment, similarly to the manufacturing method of the AlGaInP based light-emitting diode according to the first embodiment, a resist pattern 19 is used as a mask and patterning is performed by dry etching. Differently from the first embodiment, at this time point, etching damage of the end face of an active layer 12 may be low.

Next, a specified mask is used, and radical ions are injected into the end face of the active layer 12, or ions having a large ion radius are collided with the end face of the active layer 12 to alter the quality. By doing so, similarly to the first embodiment, the etching rate of the end face of the active layer 12 can be made sufficiently low as compared with the etching rate of the n-type AlInP clad layer 11 and the p-type AlInP clad layer 13.

Thereafter, the process is made to proceed similarly to the first embodiment, and the objective AlGaInP based light-emitting diode is manufactured.

According to the fourth embodiment, the same merits as those of the first embodiment can be obtained.

5. Fifth Embodiment

Manufacturing Method of AlGaInP Based Light-emitting Diode

In a manufacturing method of an AlGaInP based light-emitting diode according to a fifth embodiment, similarly to the manufacturing method of the AlGaInP based light-emitting diode according to the first embodiment, a resist pattern 19 is used as a mask and patterning is performed by dry etching. Differently from the first embodiment, at this time point, etching damage of an active layer 12 may be low.

Next, a specified catalyst is attached to the end face of the active layer 12, light is irradiated to this catalyst, heating is performed, and a chemical treatment is performed, so that the quality thereof is altered. By doing so, similarly to the first embodiment, the etching rate of the end face of the active layer 12 can be made sufficiently low as compared with the etching rate of the n-type AlInP clad layer 11 and the p-type AlInP clad layer 13.

Thereafter, the process is made to proceed similarly to the first embodiment, and the objective AlGaInP based light-emitting diode is manufactured.

According to the fifth embodiment, the same merits as those of the first embodiment can be obtained.

6. Sixth Embodiment

Manufacturing Method of AlGaInP Based Light-emitting Diode

In a manufacturing method of an AlGaInP based light-emitting diode according to a sixth embodiment, similarly to the manufacturing method of the AlGaInP based light-emitting diode according to the first embodiment, a resist pattern 19 is used as a mask and patterning is performed by dry etching. Differently from the first embodiment, at this time point, etching damage of the end face of an active layer 12 may be low.

Next, the end face of the active layer 12 is damaged by a chemical treatment, and atoms are separated. Thereafter, anneal is performed to close bonds, and the quality is altered. By doing so, similarly to the first embodiment, the etching rate of the end face of the active layer 12 can be made sufficiently low as compared with the etching rate of the n-type AlInP clad layer 11 and the p-type AlInP clad layer 13.

Thereafter, the process is made to proceed similarly to the first embodiment, and the objective AlGaInP based light-emitting diode is manufactured.

According to the sixth embodiment, the same merits as those of the first embodiment can be obtained.

7. Seventh Embodiment

GaN Based Light-emitting Diode and Manufacturing Method of the Same

Figure 8:
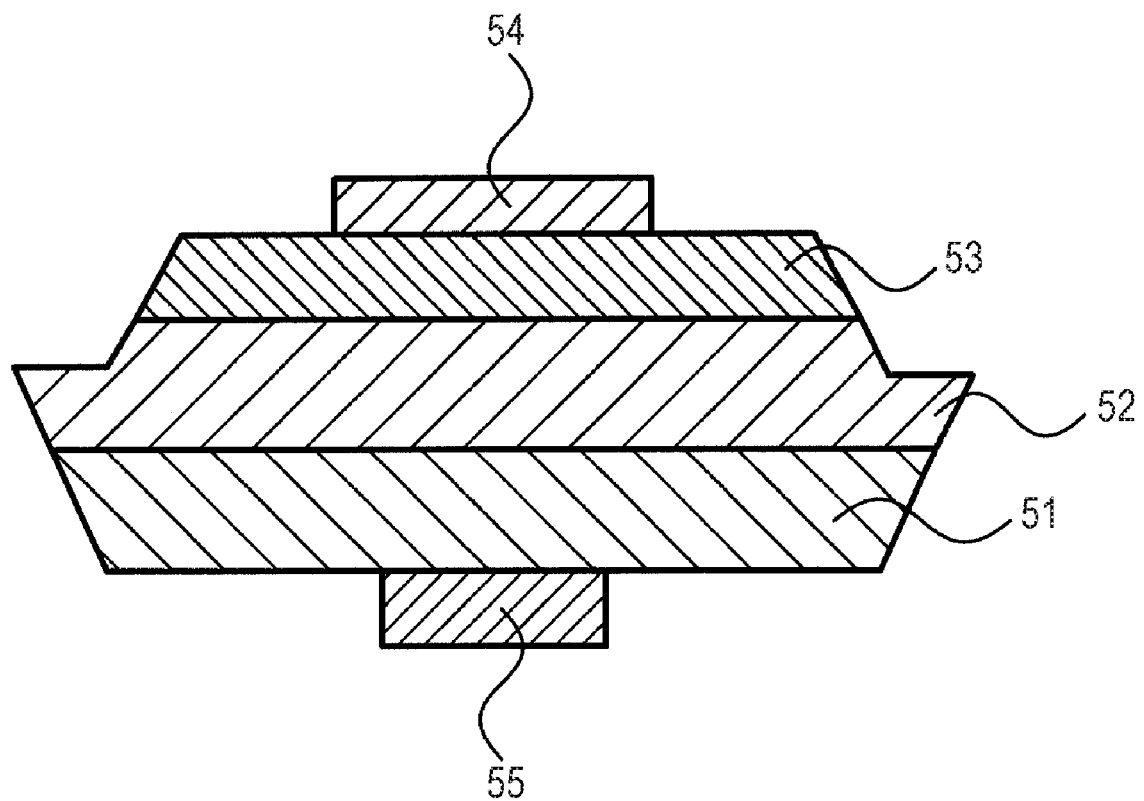
FIG. 8 is a sectional view showing a GaN based light-emitting diode according to a seventh embodiment.

FIG. 8 shows a GaN based light-emitting diode according to a seventh embodiment.

As shown in FIG. 8, in the GaN based light-emitting diode, a light-emitting diode structure includes an n-type GaN clad layer 51, an active layer 52 thereon, and a p-type GaN clad layer 53 thereon. In this case, the active layer 52 has, for example, a $Ga_{1-x}In_xN/Ga_{1-y}In_yN$ MQW structure in which a $Ga_{1-x}In_xN$ layer is a barrier layer and a $Ga_{1-y}In_yN$ layer (y>x, $0 \leq x<1$) is a well layer. The n-type GaN clad layer 51, the active layer 52 and the p-type GaN clad layer 53 have, for example, a rectangular plane shape as a whole.

The outer peripheral part of the active layer 52 protrudes to the outside from the n-type GaN clad layer 51 and the p-type GaN clad layer 53 all over the outer periphery of the active layer 52. In order words, the outer peripheral part of the active layer 52 is not sandwiched between the n-type GaN clad layer 51 and the p-type GaN clad layer 53. Although the length of the protrusion of the active layer 52 is, for example, 0.3 to 2 μm, no limitation is made to this. The length of the protrusion of the active layer 52 may not be the same all over the outer periphery of the active layer 52. Besides, the end faces of the n-type GaN clad layer 51, the active layer 52 and the p-type GaN clad layer 53 are made of inclined surfaces inclined by an angle θ ($0°<θ<90°$, for example, $30°<θ<60°$) with respect to the principal surface of these layers.

A p-side electrode 54 having, for example, a rectangular plane shape is formed on the p-type GaN clad layer 53. An n-side electrode 55 having, for example, a rectangular plane shape is formed on the lower surface of the n-type GaN clad layer 51.

In the GaN based light-emitting diode, as the need arises, a transparent resin (not shown) is formed on the end faces of the n-type GaN clad layer 51, the active layer 52 and the p-type GaN clad layer 53 and the surface of the p-type GaN clad layer 53 at a peripheral portion of the p-side electrode 54.

At the time of driving the GaN based light-emitting diode, a current made to flow between the p-side electrode 54 and the n-side electrode 55 flows through the active layer 52 at the portion sandwiched between the n-type GaN clad layer 51 and the p-type GaN clad layer 53. Light is generated in the active layer 52 at the portion through which the current flows. The current does not flow through the active layer 52 at the portion which is not sandwiched between the n-type GaN clad layer 51 and the p-type GaN clad layer 13. The light generated in the active layer 52 circulates while repeating reflection in the inside of the light-emitting diode structure including the n-type GaN clad layer 51, the active layer 52 and the p-type GaN clad layer 53. This circulating light is efficiently extracted to the outside from the lower surface of the n-type GaN clad layer 51 by the reflection at the inclined end faces of the active layer 52 and the p-type GaN clad layer 53. In addition to this, the circulating light is efficiently extracted to the outside also from the end face of the active layer 52 at the portion protruding to the outside from the n-type GaN clad layer 51 and the p-type GaN clad layer 53. By this, the circulating light in the inside of the light-emitting diode structure including the n-type GaN clad layer 51, the active layer 52 and the p-type GaN clad layer 53 can be efficiently extracted to the outside.

A specific example of sizes, materials and the like of the respective parts of the GaN based light-emitting diode are as mentioned below. The thickness of the n-type GaN clad layer 51 is, for example, 2.6 μm, the thickness of the active layer 52 is, for example, 0.2 μm, and the thickness of the p-type GaN clad layer 53 is, for example, 0.2 μm. The maximum size of the GaN based light-emitting diode is, for example, 20 μm. The p-side electrode 54 is made of a metal multilayer film of, for example, Ag/Pt/Au structure. The thickness of the Ag film is, for example, 50 nm, the thickness of the Pt film is, for example, 50 nm, and the thickness of the Au film is, for example, 2 μm. The p-side electrode 14 may be made of a single layer film of Ag. The n-side electrode 55 is made of, for example, a metal laminate film of Ti/Pt/Au structure, the thicknesses of the Ti film and the Pt film are respectively, for example, 50 nm, and the thickness of the Au film is, for example, 2 μm.

Next, a manufacturing method of the GaN based light-emitting diode will be described.

Figure 9:
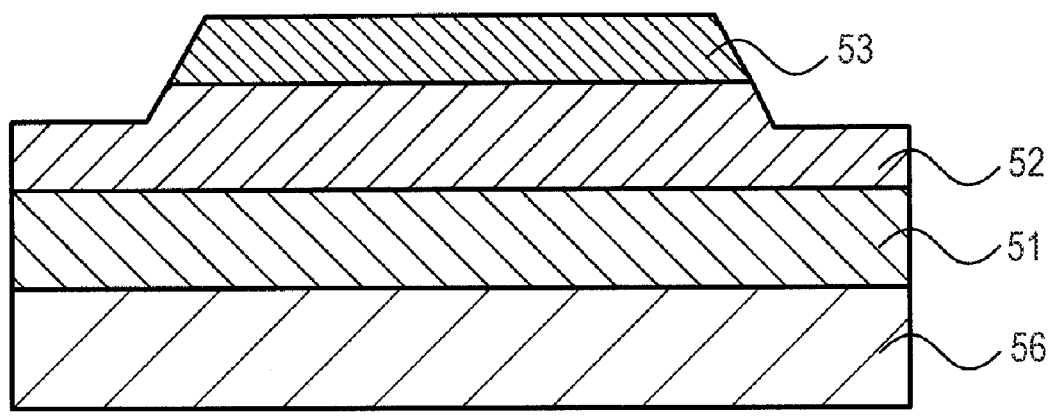
FIG. 9 is a sectional view for explaining a manufacturing method of the GaN based light-emitting diode according to the seventh embodiment.

As shown in FIG. 9, first, for example, a sapphire substrate 56 having a C+ plane as a principal surface and a thickness of 430 μm is prepared, and thermal cleaning or the like is performed to clean its surface. Next, a GaN buffer layer (not shown) having a thickness of, for example, 1 μm is first grown on this sapphire substrate 56 by, for example, a MOCVD method at a low temperature of, for example, about 500° C., and then, the temperature is raised to about 1000° C. to perform crystallization. Continuously, an n-type GaN clad layer 51 doped with, for example, Si as an n-type impurity, an active layer 52 having the MQW structure, and a p-type GaN clad layer 53 doped with, for example, Mg as a p-type impurity are successively grown on the GaN buffer layer. Here, the n-type GaN clad layer 51 is grown at a temperature of, for example, about 1000° C., the active layer 52 is grown at a temperature of, for example, about 750° C., and the p-type GaN clad layer 53 is grown at a temperature of, for example, about 900° C. Besides, the n-type GaN clad layer 51 is grown in, for example, a hydrogen gas atmosphere, the active layer 52 is grown, for example, a nitrogen gas atmosphere, and the p-type GaN clad layer 53 is grown in, for example, a hydrogen gas atmosphere.

The growth raw materials of the GaN semiconductor layers are as mentioned below. As the raw material of Ga, for example, trimethylgallium ($(CH_3)_3Ga$, TMG) is used. As the raw material of Al, for example, trimethylaluminum ($(CH_3)_3Al$, TMA) is used. As the raw material of In, for example, trimethylindium ($(CH_3)_3In$, TMI) is used. As the raw material of N, for example, ammonia ($NH_3$) is used. With respect to a dopant, as an n-type dopant, for example, silane ($SiH_4$) is used. As a p-type dopant, for example, bis(methylcyclopentadienyl)magnesium ($(CH_3C_5H_4)_2Mg$) or bis(cyclopentadienyl)magnesium ($(C_5H_5)_2Mg$) is used.

Next, the sapphire substrate 56 on which the GaN semiconductor layers are grown as described above is extracted from the MOCVD apparatus.

Next, a resist pattern (not shown) is used as a mask, and etching is performed to a halfway depth of the active layer 52 by, for example, RIE using a Cl2 gas as an etching gas under a condition in which taper etching is performed, and then, the resist pattern is removed. In this way, as shown in FIG. 9, on an upper part of the active layer 52 and the p-type GaN clad layer 53, end faces inclined with respect to the surfaces of these layers are formed.

Figure 10:
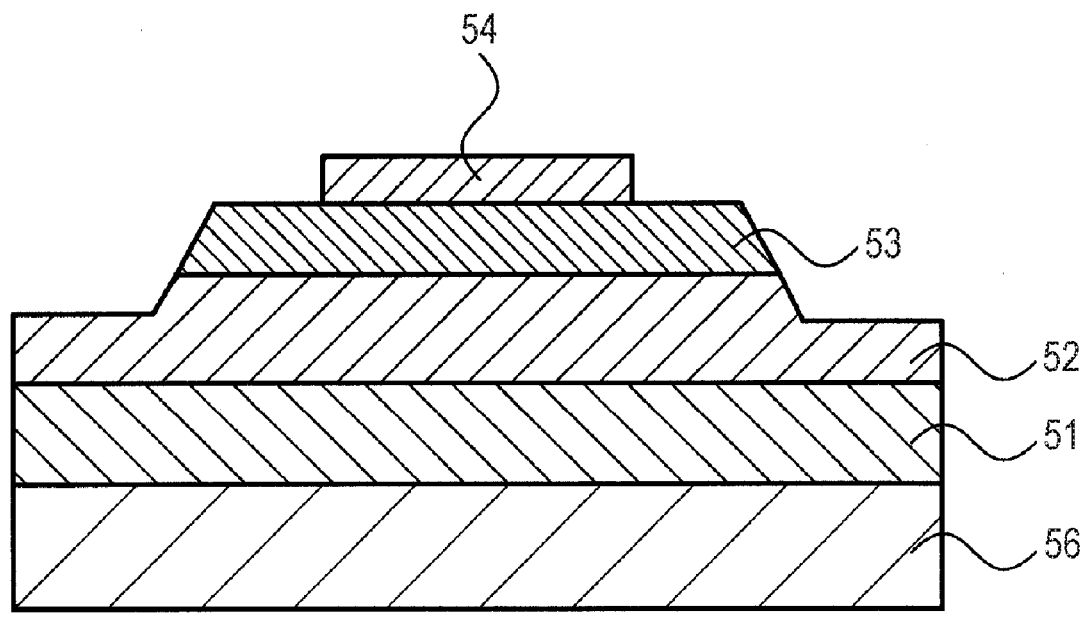
FIG. 10 is a sectional view for explaining the manufacturing method of the GaN based light-emitting diode according to the seventh embodiment.

Next, a resist pattern (not shown) having a specified plane shape is formed by lithography on the substrate surface, and further, an Ag film, a Pt film and an Au film are successively formed on the whole surface of the substrate by, for example, a sputtering method. Thereafter, the resist pattern, together with the Ag film, the Pt film and the Au film formed thereon, is removed (lift-off). By this, as shown in FIG. 10, a p-side electrode 54 having an Ag/Pt/Au structure is formed on the p-type GaN clad layer 53.

Figure 11:
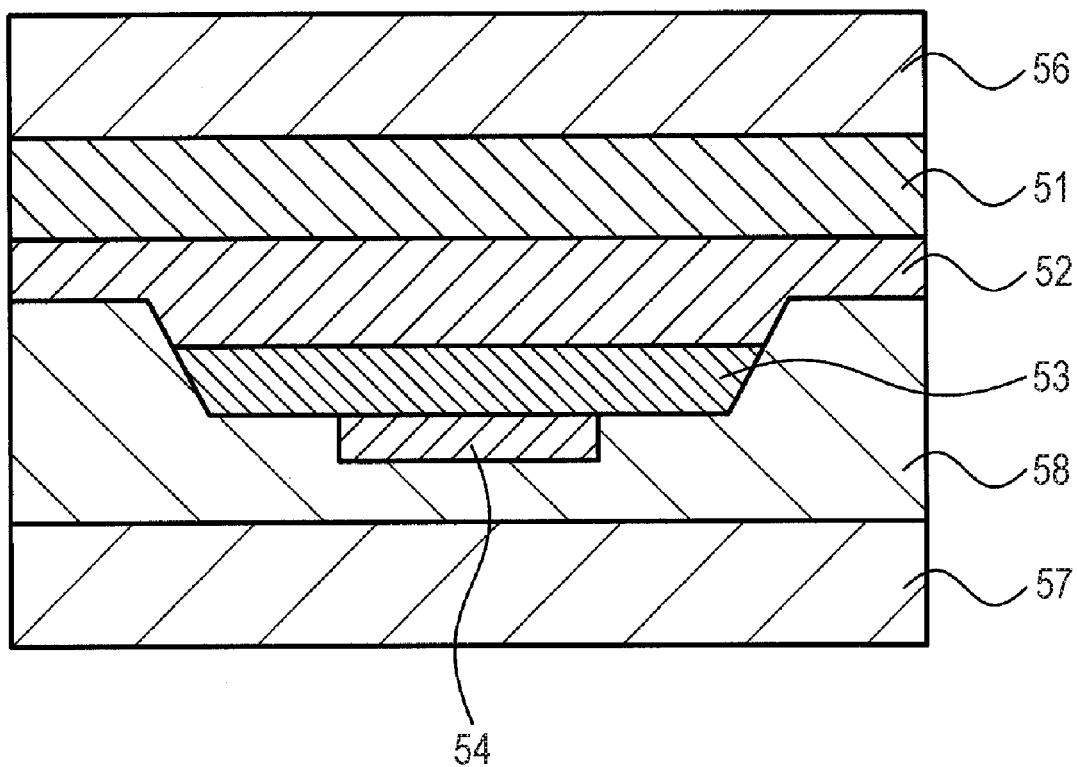
FIG. 11 is a sectional view for explaining the manufacturing method of the GaN based light-emitting diode according to the seventh embodiment.

Next, as shown in FIG. 11, the p-side electrode 54 side of the light-emitting diode structure is bonded to a support substrate 57 by using an adhesive 58. Although various substrates can be used as the support substrate 57, for example, a sapphire substrate or a silicon substrate is used.

Figure 12:
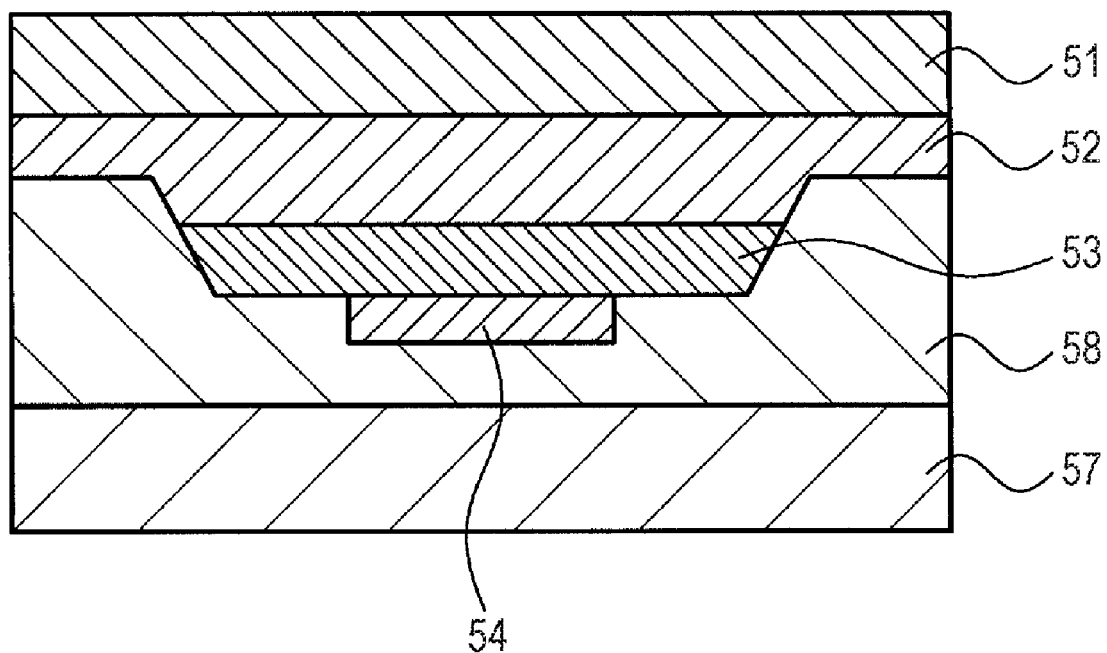
FIG. 12 is a sectional view for explaining the manufacturing method of the GaN based light-emitting diode according to the seventh embodiment.

Next, as shown in FIG. 12, a laser beam of, for example, an excimer laser is irradiated from the back surface side of the sapphire substrate 56 to perform ablation of an interference between the sapphire substrate 56 and the n-type GaN clad layer 51, and the sapphire substrate 56 is peeled off.

Figure 13:
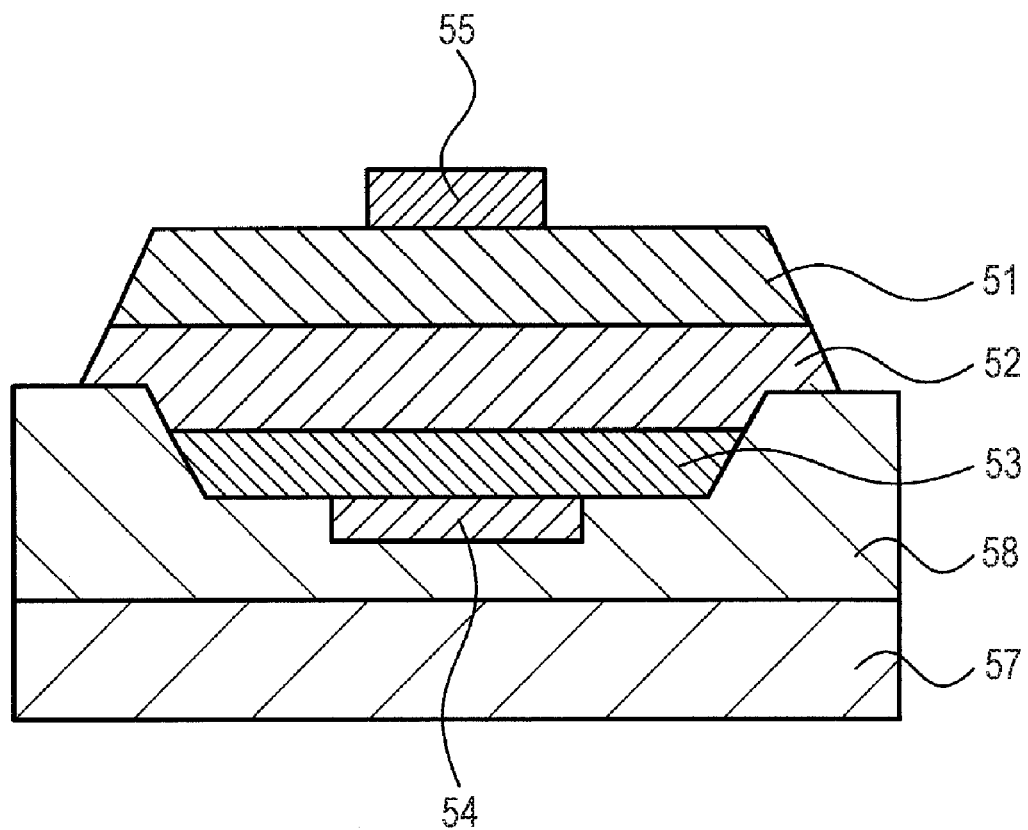
FIG. 13 is a sectional view for explaining the manufacturing method of the GaN based light-emitting diode according to the seventh embodiment.

Next, a resist pattern (not shown) having a specified plane shape is formed by lithography on the n-type GaN clad layer 51 exposed in this way. Next, the resist pattern is used as a mask, and the n-type GaN clad layer 51 and the active layer 52 are etched by ME using, for example, a Cl2 gas as an etching gas under a condition in which taper etching is performed. Thereafter, the resist pattern is removed. By this, as shown in FIG. 13, there occurs a state where the respective GaN based light-emitting diodes are separated from each other, and end faces inclined with respect to the principal surface of the n-type GaN clad layer 51 and the active layer 52 are formed on these layers.

Next, a resist pattern (not shown) having a specified plane shape is formed by lithography on the surface of the n-type GaN clad layer 51, and further, a Ti film, a Pt film and an Au film are successively formed on the whole surface by, for example, a sputtering method. Thereafter, the resist pattern, together with the Ti film, the Pt film and the Au film formed thereon, is removed (lift-off). By this, an n-side electrode 55 having a Ti/Pt/Au structure and a specified plane shape is formed on the n-type GaN clad layer 51.

Thereafter, the support substrate 57 and the adhesive 58 are removed.

By the above, as shown in FIG. 8, the objective GaN based light-emitting diode is completed. The GaN based light-emitting diode manufactured in this way may be used as a single component according to usage, or may be bonded to another substrate, transferred, or subjected to wiring connection.

As described above, according to the seventh embodiment, since the outer peripheral part of the active layer 52 protrudes from the n-type GaN clad layer 51 and the p-type GaN clad layer 53, the GaN based light-emitting diode having very high light extraction efficiency as compared with the related art can be realized. Besides, at the time of driving the GaN based light-emitting diode, since a current can be made not to flow through the outer peripheral part of the active layer 52 where there are many non-emission recombination centers, the problem that carriers injected into the outer peripheral part of the active layer 52 are wastefully consumed by the non-emission recombination centers is eliminated. By the above, the GaN based light-emitting diode having very high light emission efficiency as compared with the related art GaN based light-emitting diode can be obtained.

The GaN based light-emitting diode is suitably used for various electronic equipments such as a light-emitting diode display, a light-emitting diode backlight and a light-emitting diode illumination apparatus.

Although the embodiments and the examples of the application are described specifically, the application is not limited to the foregoing embodiments and the examples, and can be variously modified based on the technical concept of the application.

For example, the numerical values, structures, constitutions, shapes, materials and the like described in the embodiments and the examples are merely examples, and numerical values, structures, constitutions, shapes, materials and the like different from these may be used as the need arises.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A manufacturing method of a light-emitting diode, comprising:
    successively growing a first clad layer, an active layer and a second clad layer on a substrate; and
    patterning the first clad layer, the active layer and the second clad layer into a specified plane shape, and causing at least a part of an outer peripheral part of the active layer to protrude to an outside from at least one of the first clad layer and the second clad layer;
    wherein the first clad layer, the active layer and the second clad layer are patterned by dry etching;
    wherein at least one of the first clad layer and the second clad layer is side-etched with respect to the active layer, and at least the part of the outer peripheral part of the active layer protrudes to the outside from at least one of the first clad layer and the second clad layer; and
    wherein the side etching is performed by wet etching.

2. The manufacturing method of the light-emitting diode according to claim 1, wherein after the first clad layer, the active layer and the second clad layer are patterned by the dry etching, an end face of the active layer is altered in quality before the side etching is performed by the wet etching.

3. The manufacturing method of the light-emitting diode according to claim 2, wherein the active layer has a multiple quantum well structure.

4. The manufacturing method of the light-emitting diode according to claim 3, wherein the first clad layer, the active layer and the second clad layer are made of phosphorous-based compound semiconductors.

5. The manufacturing method of the light-emitting diode according to claim 4, wherein the wet etching is performed using an etchant made of hydrochloric acid cooled to a low temperature of 5° C. or lower.

6. The manufacturing method of the light-emitting diode according to claim 5, wherein after the wet etching is performed, the first clad layer, the active layer and the clad layer have end faces of (111) surfaces.

* * * * *